United States Patent [19]
Barth

[11] Patent Number: 5,943,693
[45] Date of Patent: Aug. 24, 1999

[54] ALGORITHMIC ARRAY MAPPING TO DECREASE DEFECT SENSITIVITY OF MEMORY DEVICES

[75] Inventor: Roger E. Barth, Cameron Park, Calif.

[73] Assignee: Intel Corporation, Santa Clara, Calif.

[21] Appl. No.: 08/412,555

[22] Filed: Mar. 29, 1995

[51] Int. Cl.⁶ ................................................ G06F 11/00
[52] U.S. Cl. .................... 711/220; 711/1; 711/2; 711/3; 711/5; 711/202; 711/203; 711/217; 711/218; 714/42; 714/702; 714/752; 714/761; 714/762; 365/200; 365/230.01; 365/230.03; 365/231
[58] Field of Search ..................... 395/401, 402, 395/403, 405, 421.08, 421.07, 183.18, 412, 413; 371/38.1, 39.1, 37.01, 2.2; 365/200, 230.01, 230.03, 231; 711/1, 2–3, 5, 202, 203; 714/702, 752, 762, 761, 42

[56] References Cited

U.S. PATENT DOCUMENTS

| | | | |
|---|---|---|---|
| 4,564,945 | 1/1986 | Glover et al. ........................ | 371/38 |
| 5,490,264 | 2/1996 | Wells et al. ........................... | 395/481 |
| 5,502,675 | 3/1996 | Kohno et al. ......................... | 365/200 |

*Primary Examiner*—John W. Cabeca
*Assistant Examiner*—Denise Tran
*Attorney, Agent, or Firm*—Blakely, Sokoloff, Taylor & Zafman

[57] ABSTRACT

A method and apparatus for addressing a memory device are described. A first logical address is translated into a first physical address to access a first storage location at a first row and a first column in an array of memory cells. A second logical address is translated into a second physical address to access a second storage location at a second row and a second column in the array of memory cells. The second row is separated from the first row by a row spacing factor. The second column is separated from the first column by a column spacing factor. The second level is separated from the first level by a level spacing factor. The row, column, and level spacing factors are chosen such that the first and second columns are physically distinct, the first and second rows are physically distinct, and the first and second storage locations do not share a same memory cell when the first and second logical addresses are sequential.

5 Claims, 9 Drawing Sheets

ALGORITHMIC ARRAY MAPPING TO DECREASE DEFECT SENSITIVITY OF MEMORY DEVICES

FIELD OF THE INVENTION

The present invention pertains to the field of memory devices. More particularly, this invention relates to methods and circuitry to decrease defect sensitivity of memory devices.

BACKGROUND OF THE INVENTION

Computer systems typically require a memory system for storing information. The memory system includes a collection of storage locations. Each storage location has a physical address. The collection of storage locations form an address space for the memory system. The address space for a memory system might span a number of memory devices.

One way to access the address space of a memory system is to use logical addresses. Logical addresses are a conceptual organization of the storage locations as opposed to the physical organization of the storage locations. The logical addresses are used by the computer system to access the memory system. Logical addresses must be translated or mapped by addressing circuitry to physical addresses in order to access the actual storage locations.

One type of memory device is a semiconductor memory. Semiconductor memories generally include one or more arrays of memory cells. The arrays include rows and columns of memory cells. Each cell can store one or more bits of information. Logical addresses are typically mapped to physical addresses in semiconductor memories such that sequential logical addresses are mapped into the rows and columns of the array by a linear method or an algorithm such as the Gray code. In other words, present memory architectures tend to map logically sequential addresses to physical addresses corresponding to memory cells along the same row or column or within a very few cells of each other.

One or more memory cells of the semiconductor memory may prove to be defective. A single point defect refers to an isolated defective cell within the array. Single point defects are often correctable through software or hardware correction techniques. A number of single point defects, however, can overwhelm the abilities of the correction algorithms to recover the stored data. If a defect occurs such that a substantial number of cells in a given column prove to be defective, such a defect may be called a column defect. Similarly, if a defect occurs such that a substantial number of cells in a given row prove to be defective, such a defect may be called a row defect. Another type of defect is an area defect. In an area defect, typically a number of adjacent cells, possibly spanning multiple rows or columns, prove to be defective. Non-catastrophic defects might be accounted for using error correction algorithms implemented in hardware or software. Catastrophic defects can not be accounted for and might be so substantial as to render entire rows, columns, or even the entire memory device useless.

When retrieving information from a memory system, computers tend to access groups of logically sequential addresses. In other words, related information tends to be clustered together such that the information is retrieved from groups of sequential logical addresses. One example is a burst read memory access. In a burst read access, a starting location and a number of logically sequential memory locations to be read are provided by the computer system. The addressing circuitry starts at the starting location and accesses logically sequential memory locations until the requisite number of memory locations has been read. Thus for a memory with row or column defects, addressing circuitry which uses the prior art logical-to-physical address mapping scheme is likely to access a number of point defects and is particularly susceptible to defects that generate row or column errors for a given burst mode read.

Examples of burst read applications include emulation of a disk drive storage system or transferring information between disk drive storage systems and other storage devices. In a disk drive system, data is typically stored and transferred in block units often referred to as sectors. Although sector size may vary, a typical sector size might be 512 bytes so that transfers to and from a disk drive occur in integer multiples of 512 bytes of data. Thus a burst read access might be used to access one or more sector's worth of data from the semiconductor memory.

Error detection and correction (EDAC) software might be uses to correct errors due to the defective cells. Currently EDAC is capable of correcting single or double bit errors in a single 512 byte burst. This could present problems for using EDAC to correct for row, column, and area failures because present memory architectures tend to read across full rows or adjacent rows or along the same column which in turn tend to have higher bit error rates. The higher bit error rates may exceed the capability of the error correction algorithms such that the entire burst read is considered defective due to the excessive bit error rate.

Thus one disadvantage of the prior art mapping scheme is the susceptibility to row, column, or area defects which cannot be corrected through error correction algorithms.

One method of correcting for row or column errors has used row or column redundancy during the fabrication process. The semiconductor memory is fabricated with an excess number of rows and columns of memory cells. The addressing circuitry remaps the rows or columns so that the redundant rows or columns are substituted for the defective rows or columns. Such remapping tends, however, to be ineffective for area defects unless there are a sufficient number of available redundant rows and columns. Furthermore, even if rows and columns are remapped due to area defects, all the non-defective cells in the columns and rows spanned by the area defect are no longer available for storage because the entire row or column has been replaced with a redundant row or column, respectively.

In addition, the defects within the memory device may be so numerous and distributed in such a manner so as to result in catastrophic failures for a substantial number of block reads. If the number of catastrophic failures exceeds a certain threshold, the memory device may not even be marketable and thus will need to be scrapped.

Thus another disadvantage of the prior art mapping scheme is that production yield for the memory devices is particularly sensitive to the physical distribution of the defects within the memory device.

SUMMARY AND OBJECTS OF THE INVENTION

One of the features of the present invention is to provide addressing circuitry to help decrease defect sensitivity of memory devices.

The present invention provides for a method of addressing an n-dimensional memory system. A first logical address is received. The first logical address is translated into a first physical address to access a first storage location located at first row, a first column, and a first level in an array of memory cells. A second logical address is received, the second logical address logically sequential to the first logical address. The second logical address is translated into a second physical address to access a second storage location located at a second row, a second column, and a second level in the array of memory cells. The second row is separated from the first row by a row spacing factor. The second column is separated from the first column by a column spacing factor. The second level is separated from the first level by a level spacing factor. The row, column, and level spacing factors are chosen such that the first and second columns are physically distinct, the first and second rows are physically distinct, and the first and second storage locations do not share a same memory cell.

Memory addressing circuitry for accessing an n-dimensional memory system is also described. The memory addressing circuitry includes address translation circuitry for translating a first logical address into a first physical address corresponding to a first storage location at a first row, a first column, and a first level in an array of memory cells. The address translation circuitry translates a second logical address into a second physical address corresponding to a second storage location at a second row, a second column, and a second level of the array of memory cells. When the second logical address is logically sequential to the first logical address, the second column is separated from the first column by a column spacing factor, the second row is separated from the first row by a row spacing factor, and the second level is separated from the first level by a level spacing factor. The column, row, and level spacing factors are chosen such that the first and second columns are physically distinct, the first and second rows are physically distinct, and the first and second storage locations do not share a same memory cell.

Other objects, features, and advantages of the present invention will be apparent from the accompanying drawings and from the detailed description that follows below.

BRIEF DESCRIPTION OF THE DRAWINGS

The present invention is illustrated by way of example and not limitation in the figures of the accompanying drawings, in which like references indicate similar elements and in which.

DETAILED DESCRIPTION

Figure 1:
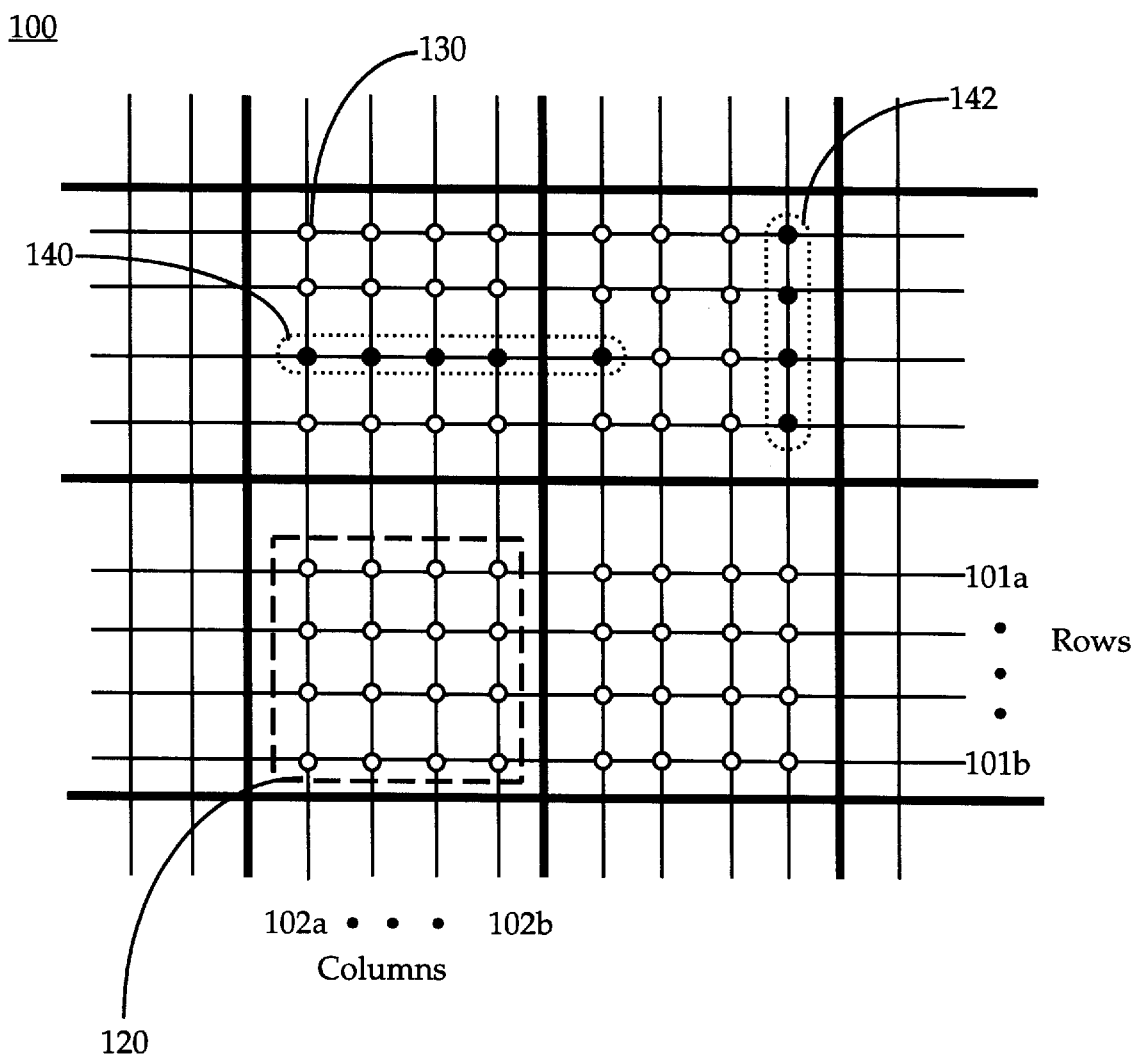
FIG. 1 illustrates a memory array.

FIG. 1 illustrates the locations for three types of memory defects that might occur in an array of storage locations. The array includes rows (e.g., 101a through 101b) and columns (e.g., 102a through 102b) of memory cells (e.g., 130). In a row defect, a substantial number of memory cells (e.g., 140) along the row might be unusable. In a column defect, a substantial number of memory cells (e.g., 142) along the column might be unusable. Row and column defects are called group defects because typically a group of cells are affected by a feature that the group shares in common (such as a common row or a common column).

Row or column failures create array defects that tend to cause multiple errors in a burst read because of the prior art sequential addressing of the array along rows or columns during the burst read.

Another type of defect is an area defect. Memory array 100 can be further subdivided into smaller areas such as area 120. An area defect might cause a number of cells within a given area to be unusable. An area defect is also a group defect, but the common feature is that a number of defective cells are located within a common area of the memory array. Area defects typically affect adjacent memory cells that do not necessarily all share the same row or column. Thus area defects can span a number of rows and columns but do not necessarily affect a substantial number of memory cells on a given row or column. Area defects might occur due to contamination during fabrication. Statistically, a typical size of an area defect can be determined for example such that 90% of the area defects will span an area of that size or less.

Figure 2:
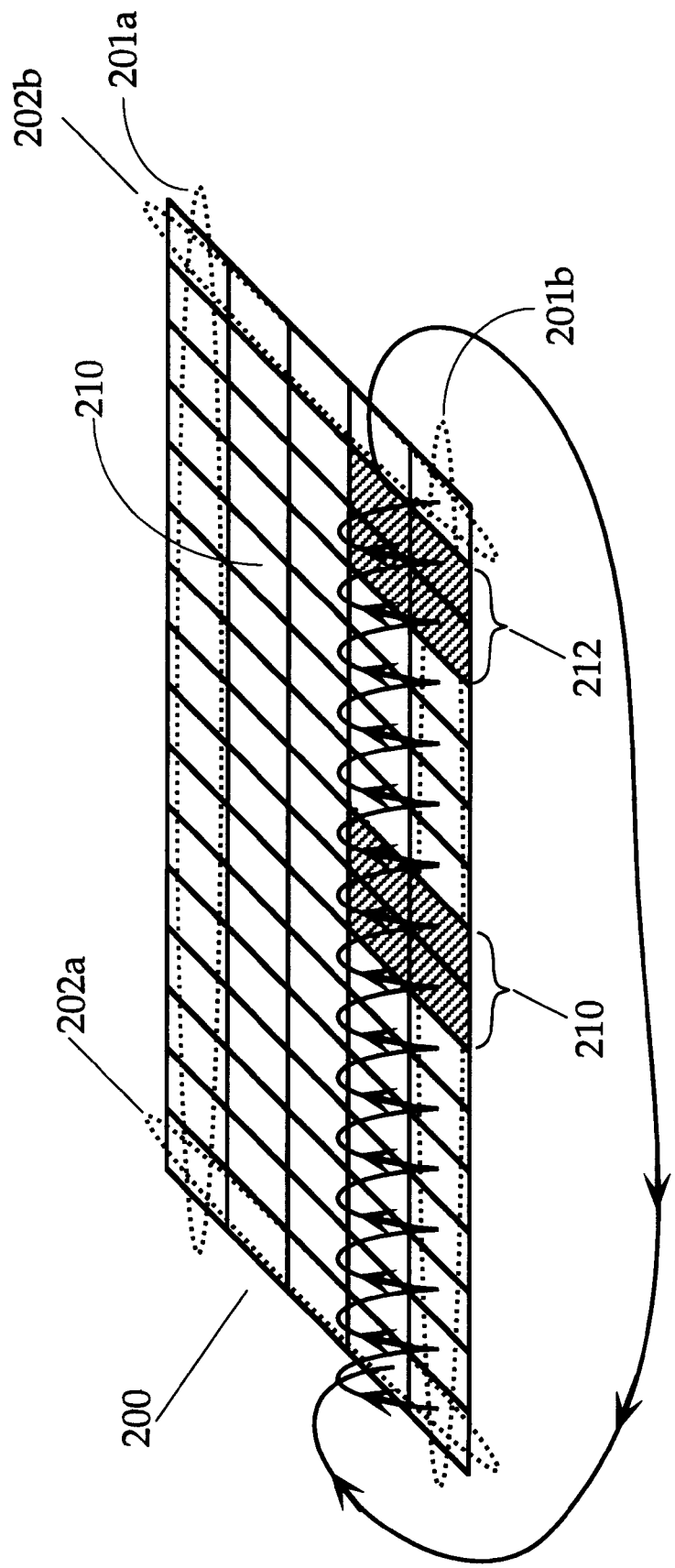
FIG. 2 illustrates a prior art logically sequential address to physical address translation scheme.

FIG. 2 illustrates conceptually the prior art logical-to-physical address translation for logically sequential addresses. Array 200 includes rows (201a through 201b) and columns (202a through 202b) of memory cells (e.g., 210). Note that because the addressing proceeds along row 201b, the prior art addressing scheme will encounter multiple defective cells in area defects 210 and 212.

To avoid this, the logical addresses might be translated in such a manner so as to ensure that a burst read of a given size will address the same row, column, or area as few times as possible for that burst read operation. Ideally, a given burst read operation should not access two memory cells that share a common group defect. If this is this case, sequential logical addresses will not encounter multiple defective cells from a given row, column, or area defect. In essence, even though a burst read might encounter multiple group defects, the burst read will ideally access at most one defective cell from each group defect. Row, column, and small area failures now present point defect problems that might be corrected through EDAC. This overcomes the problems using the prior art addressing scheme because logically sequential addresses are mapped to physical addresses in such a way so as to decrease the probability that the corresponding memory cells are located within the same group defect. Thus group failures are converted to multiple point failures. Present redundancy schemes can still be used within the component to maximize yields and to further reduce the density of failures to an acceptable level.

The total number of defective storage locations remains constant and cannot be changed by merely changing the logical-to-physical address translation algorithm. However, statistically the defective cells tend to be unevenly distributed throughout the memory array such that a higher probability density of defective cells occurs along rows or columns or within a fixed distance from another defective cell. A prior art mapping system which translates logically sequential addresses into physical addresses that correspond to memory cells within a short distance from each other or along a common column or row will result in burst read modes having a higher cumulative probability distribution of error. The given error correction algorithm might not be able to overcome the higher cumulative probability distribution. Thus the error rate per burst read may vary significantly from the error rate for the entire array.

Two methods of overcoming this include (1) grouping as many defective cells as possible into as few burst read groups as possible, or (2) distributing the defective cells evenly so that as many burst read groups as possible have error densities within acceptable limits for error correction.

The first method is essentially accomplished by the redundant row and column technique. Because defective cells are statistically grouped along a common column or row, the cells are already statistically grouped and the entire row or column is replaced with a redundant row or column during the fabrication process. Another way of accomplishing the first method is to use a software memory manager. The grouped defects are mapped using software so that the memory manager prevents the use of any memory located within those groups.

The second method might seem impossible because once the memory device is fabricated, the physical distribution of the defective cells cannot be changed. However, by using the appropriate addressing circuitry, the logically sequential addresses used for storing and reading operations can ensure that the corresponding physical locations are distributed in a manner such that the error density for each burst read does not vary significantly from the error density for the entire array.

Let $n_i$=unit of data read in the ith burst read, for this example assume $n_i$ is constant for all i, and that $n_i$=n $N=\Sigma n_i$=i×n=total number of cells in the array $d_i$=total number of defective cells in the ith burst read; and $D=\Sigma d_i$=total number of defective cells in the array $e_i=d_i/n$=error density for the i th burst read $E=D/N$=error density for the array or average error density per burst read $\epsilon$=acceptable error density To simplify matters further, assume that n is 1 so that the acceptable error density is an acceptable error density per burst read. Then the error density, $e_i$, becomes the number of defective cells in the ith burst read, $d_i$ and $\epsilon$ is interpreted as the acceptable number of defective cells for a burst read.

Because of the clustered distribution of the defective cells, there may be a large variance in $e_i$ from E. In other words, the error density might tend to fluctuate substantially between burst reads such that a number of burst reads exceed the acceptable error density, $\epsilon$, and a number of burst reads are within the acceptable error density. The goal of the addressing circuitry should be to map the logically sequential addresses in such a manner so as to increase the number of burst reads for which the error density, $e_i$, is at or below $\epsilon$. By distributing the defective cells throughout the burst reads, the algorithmic addressing circuitry effectively causes $e_i$ to approach E for all of the burst reads, instead of being substantially below E for some reads and substantially above E for other reads. In statistical terminology, if X is a random variable representing the number of defects in a burst read, then the algorithmic addressing circuitry is used to decrease the variance, $\sigma_X^2$, in the defect errors between burst reads. This can result in more burst reads that have a defect density less than $\epsilon$.

Figure 3A:
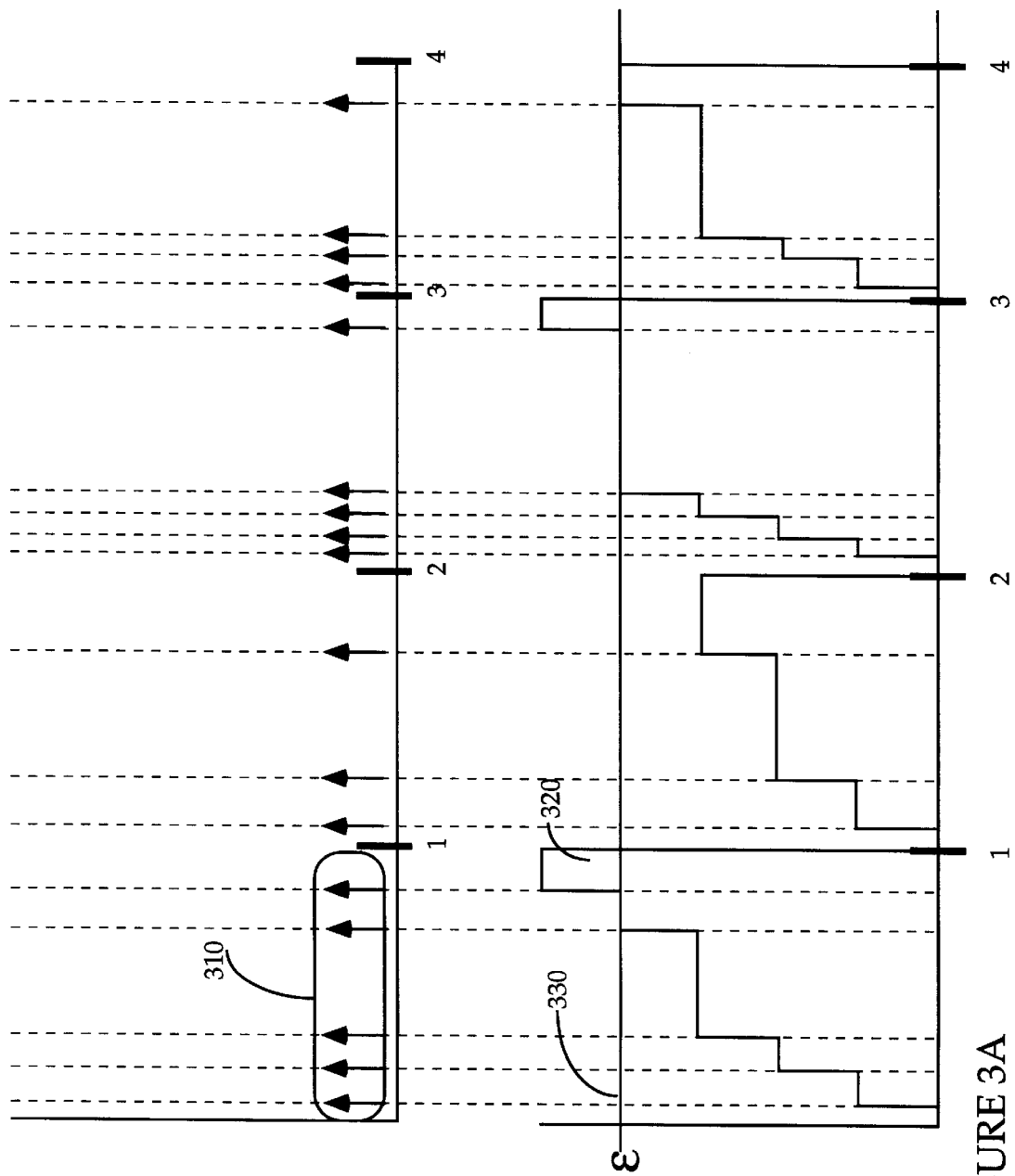
FIG. 3a illustrates the defect density and cumulative defect distribution per burst read using the prior art logically sequential address to physical address translation scheme on a given memory device.
Figure 3B:
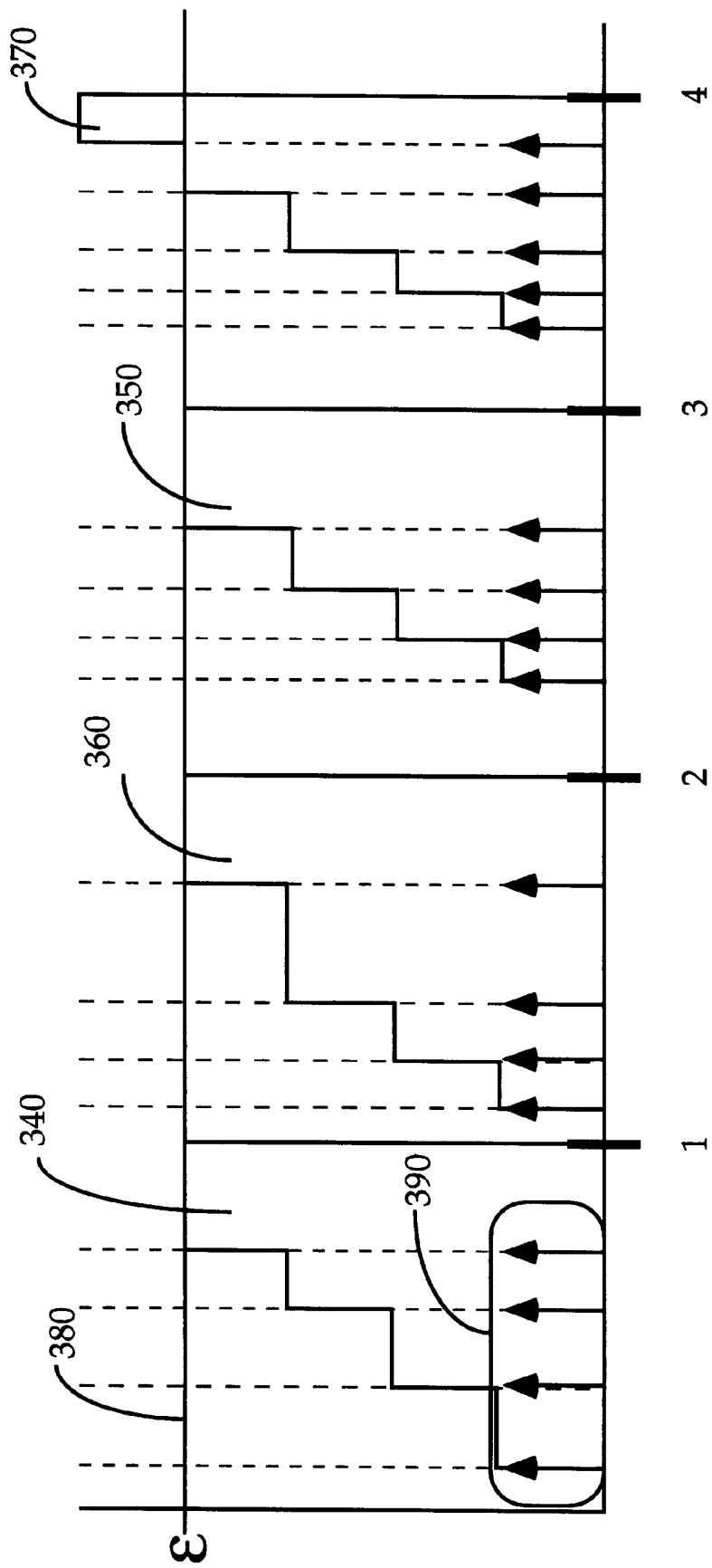
FIG. 3b illustrates a defect density and cumulative defect distribution per burst read using the algorithmic addressing circuitry.

FIGS. 3a and 3b illustrate the effect of remapping logically sequential addresses. FIG. 3a illustrates a hypothetical defect density for four different burst read groups using the prior art addressing scheme. The defective cells are represented as spikes (310) and they tend to be clustered so that there is an unequal distribution of defective cells among the groups of cells read in distinct burst read operations. FIG. 3a also illustrates the cumulative error distribution (320) for each of the groups of cells. Note that the first and third group of cells have a defective cell count in excess of $\epsilon$, the acceptable error density 330. FIG. 3b illustrates the defect density and the cumulative error distribution that result from remapping the cells. By remapping the cells, the defective cells are more evenly distributed among all of the groups (e.g., group 390). This in turn reduces the defect density and therefore the cumulative error distribution for some of the groups (340, 350) and increases the defect density and therefore the cumulative error distribution for other groups (360, 370). The net result in this case however is a gain in the total number of groups of data having an acceptable level of defects (i.e., at or below $\epsilon$).

Figure 4:
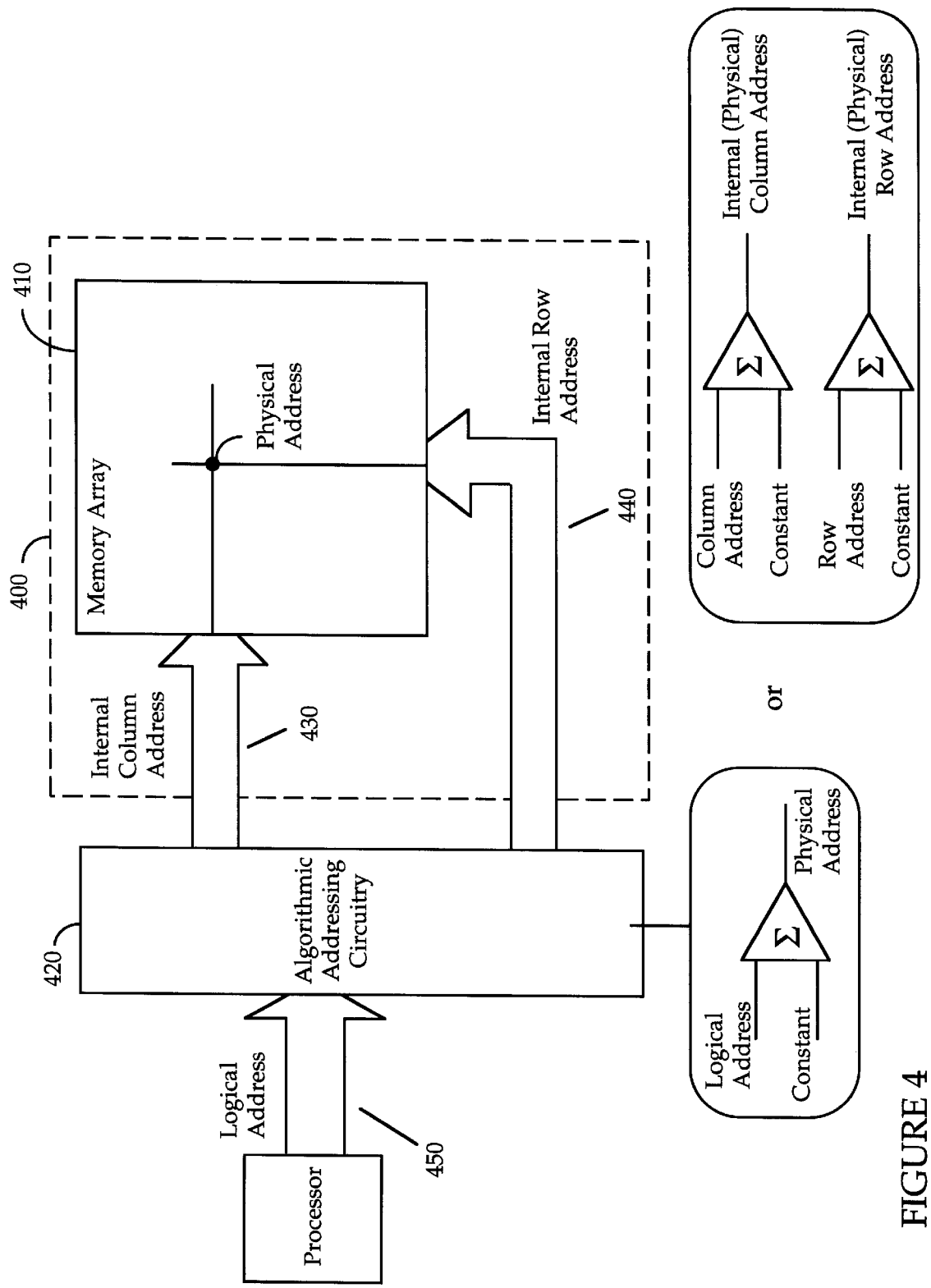
FIG. 4 illustrates the algorithmic addressing circuitry in conjunction with the memory array.

FIG. 4 illustrates how the algorithmic address circuitry might be used with a memory device. Memory device 400 includes an array 410 of memory cells. The algorithmic address circuitry 420 receives the logical address 450 from the computer system and translates that address according to some algorithm into column 430 and row 440 addresses within the memory device. The algorithm implemented might be any one of a number of mapping algorithms which minimizes the impact of row, column, multiple column, multiple row, or array defects on the physical addressing scheme.

Figure 5:
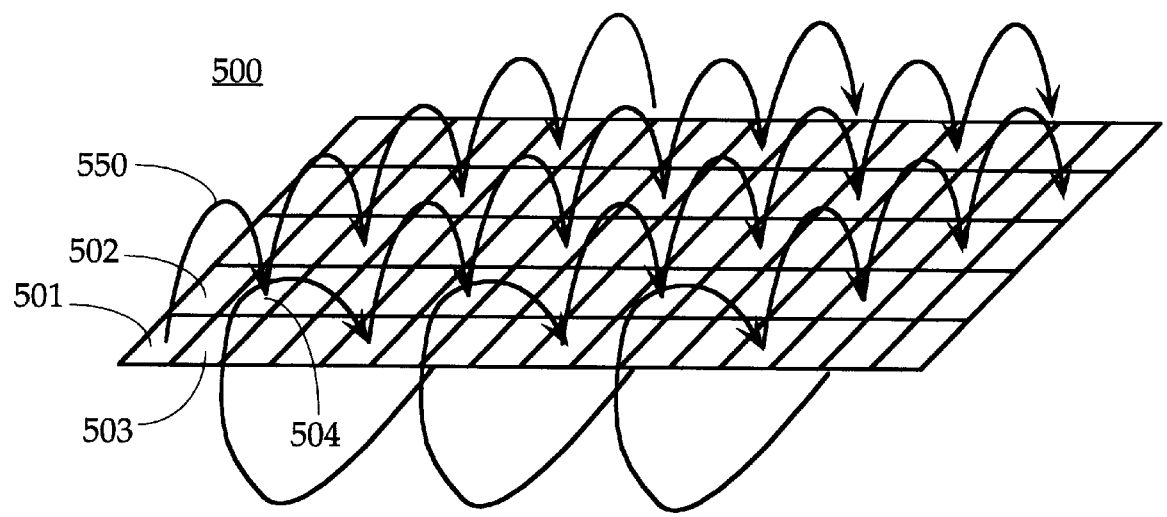
FIG. 5 illustrates logically sequential address to physical address translation using the algorithmic addressing circuitry with a (1, 1) spacing factor.

FIG. 5 graphically illustrates the effect of one such algorithm. FIG. 5 illustrates an array 500 of four rows and columns. The algorithmic address circuitry translates sequential logical addresses into physical addresses which proceed diagonally across the array as indicated by path 550. By selecting memory cell 504 instead of cells 502 or 503 as the cell logically sequential to cell 501, the algorithmic addressing circuitry avoids selecting adjacent defective cells on the same row or column. This physical separation between logically sequential addresses will be referred to as the "spacing factor." The spacing factor in FIG. 5 is one row and one column or (1, 1) where (x, y) represents (x rows, y columns).

The spacing factor should be chosen to reduce the susceptibility of the addressing scheme to row, column, and area defects. F:or example, area defects introduced during fabrication might tend to affect clusters of adjacent cells. Thus referring to FIG. 1, if area 120 is defective then all the cells within that area might be considered defective. Any algorithm that translates sequential logical addresses in a manner that proceeds diagonally across the array with a (1, 1) spacing factor will still be susceptible to such an area defect. By choosing a spacing factor other than (1, 1), the algorithm might ensure that sequential logical addresses are translated into physical addresses that do not share the same column, row, or area.

If area defects tend to affect clusters of four adjacent cells, for example, then a spacing factor of (1, 2) or greater might be used. Assuming 5 the area defect is shaped as a square, any spacing factor such that $|x|+|y|>2$ might be used. To ensure that the same columns or rows are not used for logically sequential addresses, |x| and |y| should be at least 1. To generalize the rule for a substantially square area of s cells, x and y might be chosen such that $|x|+|y|>\sqrt{s}$ and x, y≠0.

Figure 6:
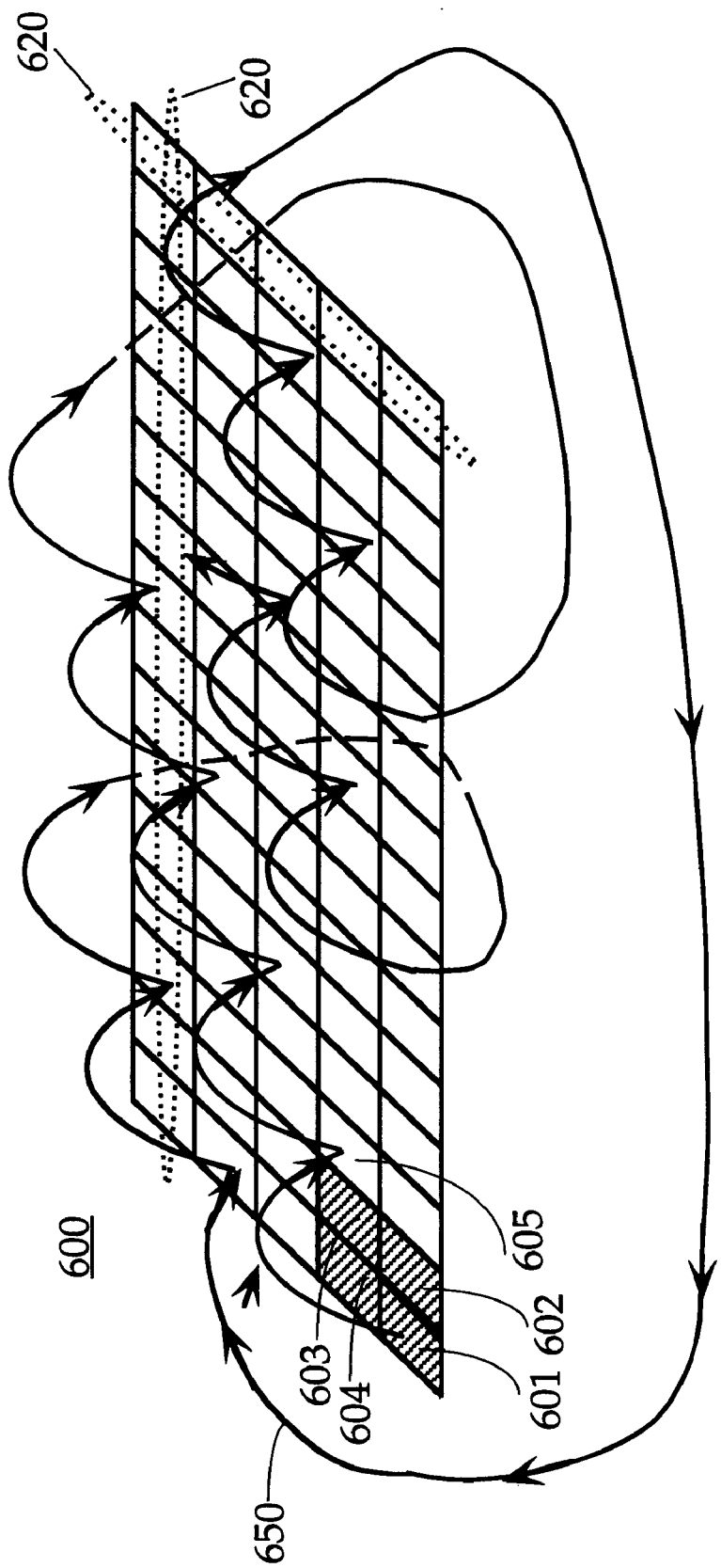
FIG. 6 illustrates logically sequential address to physical address translation using the algorithmic addressing circuitry with a (1, 2) spacing factor.

FIG. 6 illustrates a sequential logical to physical address translation scheme using a spacing factor of (1, 2) instead of (1, 1). By selecting memory cell 605 instead of cells 602, 603, or 604 as the cell logically sequential to cell 601, the algorithmic addressing circuitry avoids selecting adjacent defective cells on the same row, column, or area. The path 650 indicating the physical location for subsequently read cells does not encounter consecutive defective cells within the same group defect because the spacing factor was chosen large enough to avoid other defective cells in the same area defect for a typically sized area defect (in this example a square area of 4 cells).

One potential disadvantage might be an increase in memory access time. In a conventional burst read an entire row of information might be latched simultaneously. Use of the algorithmic address circuitry might decrease the speed of a fast burst read because multiple rows instead of single rows might have to be addressed to retrieve "sequentially" stored information.

The examples presented above have illustrated applications using two-dimensional arrays of memory cells. However, the algorithmic addressing circuitry might be modified for three-dimensional storage arrays as well. A three-dimensional array might be constructed from multiple two-dimensional arrays of memory cells or from layers of two-dimensional arrays of memory cells (Type 1) in a single memory device. Another example is a two-dimensional array of multi-level cells (Type 2). In addition memory arrays on different integrated circuits or in different memory devices could be considered to be a Type 1 three-dimensional memory array.

Figure 8A:
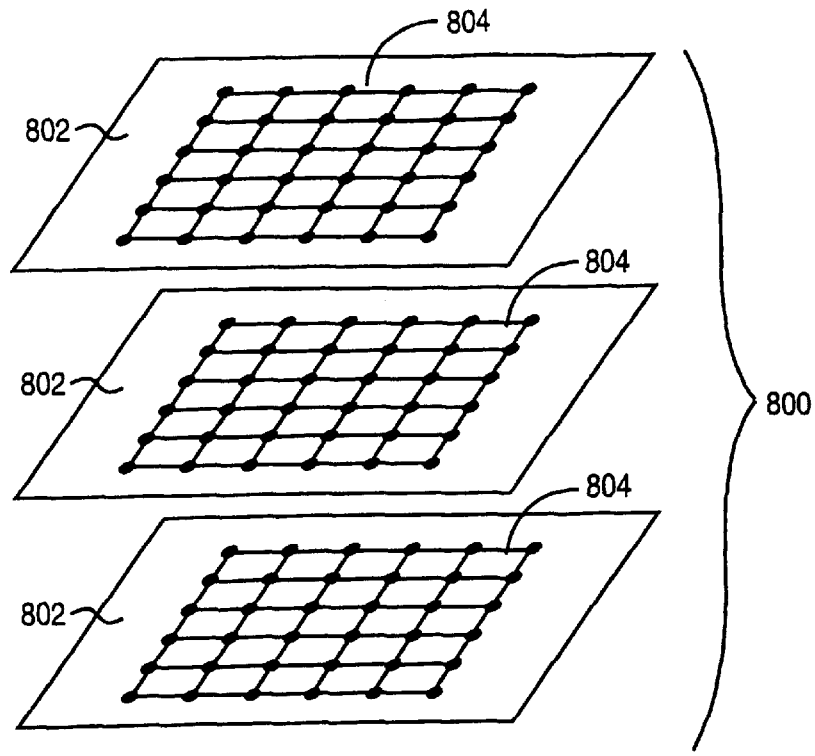
FIG. 8A illustrates a three dimensional array where each layer has at least one memory array.
Figure 8B:
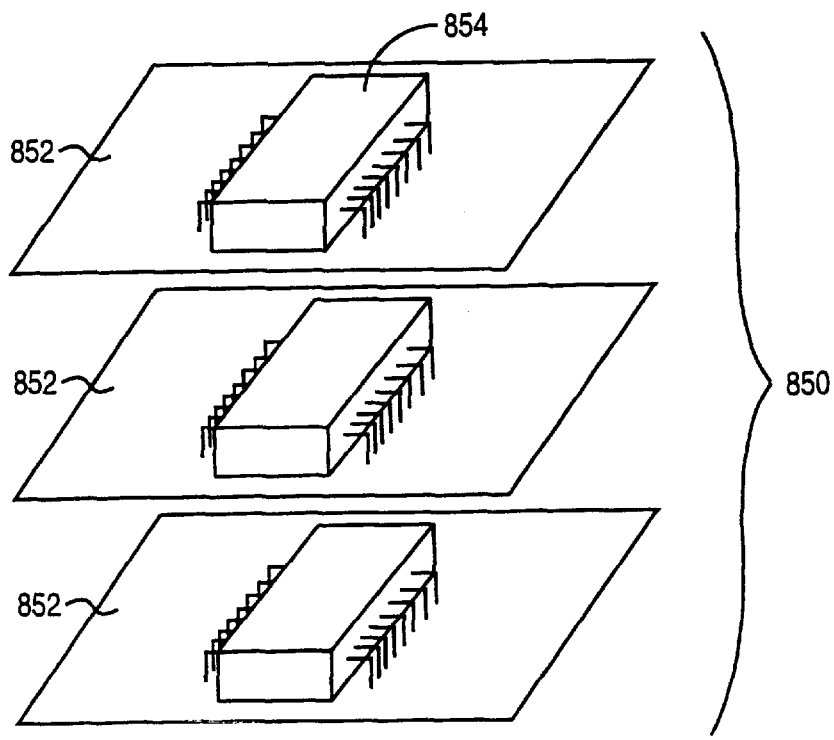
FIG. 8B illustrates a three dimensional array where each layer has at least one integrated circuit.

For example, FIG. 8A illustrates a three dimensional array 800 where each layer 802 has at least one memory array 804. FIG. 8B illustrates a three dimensional array 850 where the memory arrays are integrated circuits such that each layer 852 has at least one integrated circuit memory 854.

Multi-level memory cells can store multiple values in the same memory cell. Each defective multi-level cell can affect more than one bit of information so sequential logical addresses should not translate into the same multi-level cell. Also, errors due to area defects in a particular layer of a multi-layer array can be reduced during burst reads by ensuring that sequential logical addresses translate into different layers of the multi-layer array. Thus by selecting different layers or different array within the memory device for sequential logical addresses, the burst read might be made less susceptible to area defects for Type 1 storage arrays. However, selecting different levels for sequential logical addresses for Type 2 storage arrays does not guarantee a distinct column or row or even a different cell, and therefore the addressing circuitry must still ensure that a different row, column, and cell are selected. Thus a third spacing dimension, z, is introduced by the algorithmic addressing circuitry to ensure that sequential logical addresses are translated into physical addresses that do not share the same column, row, or layer\level. The spacing factor is now expressed as (x, y, z) which is equivalent to (row, column, layer\level).

Figure 7:
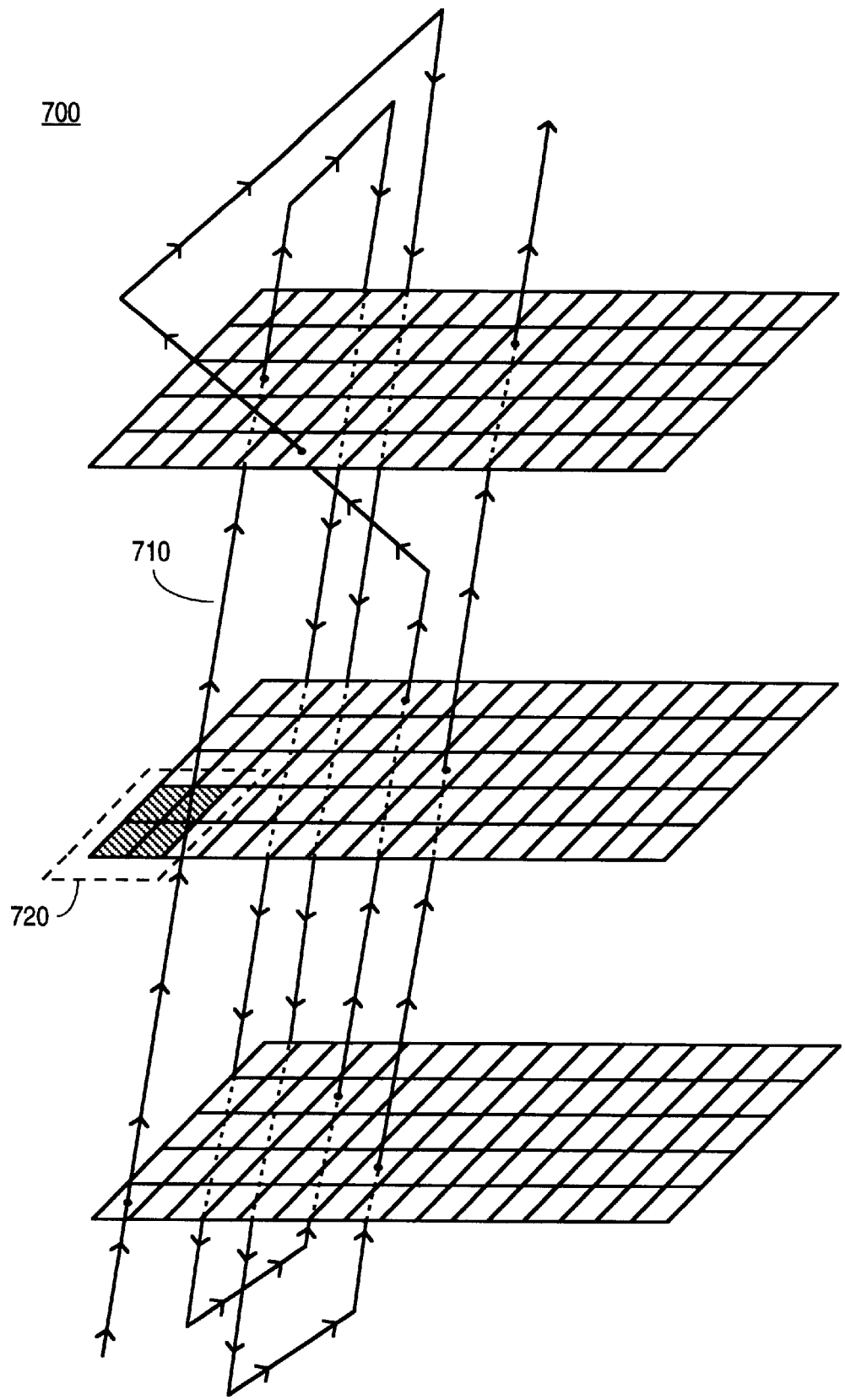
FIG. 7 illustrates a logically sequential address to physical address translation using the algorithmic addressing circuitry with a (1, 1, 1) spacing factor.

FIG. 7 illustrates the application of spacing factors to three-dimensional arrays of storage devices. The spacing factor can continue to be dimensionally expanded to further reduce susceptibility to group defects in that dimension. Thus an n-dimensional memory array might have up to n spacing factors (one for each dimension) in order to decrease the susceptibility to group defects in one or more of the n dimensions. For example, one dimension could be attributed to banks of memory devices and thus the susceptibility to group defects at the memory bank level (i.e., one or more memory devices in the bank are defective) can be reduced. In practice, however, there is a tradeoff between access speed and the complexity of the addressing circuitry that might be weighed against any reduction in susceptibility to burst read errors. For example, the practitioner might determine that replacing a defective bank of memory devices is preferable over an increase in the complexity of the addressing circuitry to account for it.

FIG. 7 illustrates a sequential logical to physical address translation scheme using a spacing factor of (1, 1, 1) as indicated by path 710. Note that because sequential logical addresses are translated into different levels in three-dimensional array 700, group defect 720 is "pierced" instead of traversed by path 710. In the two-dimensional arrays, the errors due to area defects were minimized by selecting x and y large enough to place sequential logical addresses into different areas of the cell. However, smaller x and y values might be used with the Type 1 three-dimensional scheme because the area defect may not exist on a different level.

By changing layers, a different row and column are being used in the Type 1 three-dimensional array. By the very nature of the Type 1 three-dimensional array a row on one layer is physically distinct from a row on another layer. Similarly, a column on one layer is physically distinct from a column on another layer. Thus for a Type 1 three-dimensional array, a spacing factor of (0, 0, 1) will ensure that a physically distinct row and column are used for sequential logical addresses. As long as the z component of the spacing factor is non-zero, the x and y components may be freely chosen. Thus acceptable spacing factors include the set (x, y, z) with the restriction z≠0 and at least one of x or y is not equal to zero.

In contrast, for a Type 2 three-dimensional storage array, a spacing factor of (0, 0, 1) will not ensure that a distinct row and column are used for sequential logical addresses. To the contrary, by only changing levels, logically sequential addresses might refer to the exact same memory cell. This might tend to increase errors in a burst read if the memory cell is defective. For a Type 2 storage array, the x and y components of the spacing factor should be non-zero. However, the z component may be zero or non-zero as desired. Thus (1, 1, 0) or (1, 1, 1) will ensure that distinct rows and columns are used for logically sequential addresses. Acceptable spacing factors include the set (x, y, z) where x,y≠0.

Although x, y, and z have been shown as positive numbers, they can be negative integers or in some cases as described above zero.

For one embodiment, the address translation circuitry is included in an integrated circuit with a semiconductor memory. For another embodiment, the address translation circuitry is located external to the integrated circuit with the semiconductor memory. Thus it is possible to add the address translation circuitry to computer systems and continue to use currently available memory devices. This helps to increase the effective yield of memory devices because computer systems which use such address translation circuitry could account for higher error rates. Alternatively, less sophisticated error correction techniques could be used to achieve the same defect sensitivity level.

In one embodiment, the addressing circuitry used to accomplish the translation scheme described above consists of one or more adders. The adders add a constant to accomplish the spacing desired. Mathematically speaking, the constant is added to the logical address to achieve the desired spacing factor. A physical implementation might use the adders before or after translation to a physical address in order to accomplish the same effect. In other words, for one embodiment the adders are located such that a constant spacing factor is added to the logical address itself. Alternatively, in another embodiment, the adders are located such that some constant is added to each component (e.g., row, column, etc.) of the physical address after the prior art logical-to-physical address translation has taken place. Mathematically, the effect is to add some constant to the logical address.

For example, if the prior art address translation scheme simply follows a row of cells for logically sequential addresses, the algorithmic addressing circuitry might add a 2 to the column (y) address. This results in a (1, 2) spacing factor if the row (x) address was already being incremented by one. Thus the constant added is (0, 2) to accomplish an overall (1, 2) spacing factor. A 4-bit column addressing circuitry accesses up to 16 distinct columns identified as column 0 to column 15. If the addressing circuitry implements the spacing factor by adding constants to the y address, the addressing circuitry need not handle the case in which y+2>15 as a special case. If y+2=16, ($16_{10}=10000_2$) the addressing circuitry ignores the carry bit and wraps around to column 0 again. (The "10" and "2" subscripts are used to denote the decimal and binary base systems, respectively). In other words, if y=$14_{10}$ ($1110_2$), then adding $2_{10}$ to $14_{10}$ results in $16_{10}$ which requires 5 bits to express. A 4-bit addressing circuitry, however, only keeps the least significant 4 bits, which results in zero in this example. Thus the 4-bit addressing circuitry automatically "wraps around" and selects column 0. Of course, the addressing circuitry should be designed in such a manner so as to ensure that the all of the logically sequential addresses for a given burst read uniquely map onto distinct storage locations.

In the preceding detailed description, the invention is described with reference to specific exemplary embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. A method of addressing a memory comprising the steps of:

a) receiving a first logical address for a memory comprising a plurality of multi-level memory cells organized as a three dimensional storage array;

b) translating the first logical address to a first physical address corresponding to a first row, a first column, and a first layer of the storage array associated with a first memory cell; and c) computing a second physical address corresponding to a second logical address, wherein the second logical address is logically sequential to the first logical address, wherein the second physical address corresponds to a second row, a second column, and a second layer of the storage array associated with a second memory cell, wherein the first and second rows are distinct, wherein the first and second columns are distinct, wherein the first and second cells are not a same memory cell.

2. The method of claim 1 wherein step c) further comprises the step of:

i) adding a column spacing factor to a column address portion of the first physical address to compute a column address portion of the second physical address.

3. The method of claim 1 wherein step c) further comprises the step of:

i) adding a row spacing factor to a row address portion of the first physical address to compute a row address portion of the second physical address.

4. The method of claim 1 wherein the first and second physical addresses are separated by a row spacing factor x and a column spacing factor y wherein if s represents the number of adjacent cells in a typically sized area defect, then the row and column spacing factors are selected such that x, y≠0 and $|x|+|y|>\sqrt{s}$.

5. The method of claim 1 wherein step c) further comprises the step of:

i) adding a layer spacing factor to the first layer to locate the second layer within the storage array.

* * * * *

UNITED STATES PATENT AND TRADEMARK OFFICE
CERTIFICATE OF CORRECTION

PATENT NO.    : 5,943,693
DATED         : August 24, 1999
INVENTOR(S)   : Barth

It is certified that error appears in the above-identified patent and that said Letters Patent is hereby corrected as shown below:

Column 2,
Line 18, delete "uses" and insert -- used --.

Column 9,
Line 18, after "the", insert -- preceding --.

Signed and Sealed this

Eighteenth Day of March, 2003

JAMES E. ROGAN
*Director of the United States Patent and Trademark Office*